US012130319B2

(12) United States Patent
Orio

(10) Patent No.: US 12,130,319 B2
(45) Date of Patent: Oct. 29, 2024

(54) ELECTROSTATIC CHARGE SENSOR WITH HIGH IMPEDANCE CONTACT PADS

(71) Applicant: STMICROELECTRONICS S.r.l., Agrate Brianza (IT)

(72) Inventor: Massimo Orio, Milan (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 18/320,867

(22) Filed: May 19, 2023

(65) Prior Publication Data

US 2023/0288467 A1 Sep. 14, 2023

Related U.S. Application Data

(63) Continuation of application No. 17/537,069, filed on Nov. 29, 2021, now Pat. No. 11,693,039.

(51) Int. Cl.
*G01R 29/12* (2006.01)
*G01R 29/08* (2006.01)
*G01R 29/24* (2006.01)

(52) U.S. Cl.
CPC ......... *G01R 29/12* (2013.01); *G01R 29/0878* (2013.01); *G01R 29/24* (2013.01)

(58) Field of Classification Search
CPC .. H05F 3/04; H05F 3/02; G01R 29/12; G01R 29/24; G01R 29/0878; G01R 15/165; G01R 29/0814; G01R 31/001; G01R 31/002; G01R 31/14; G01R 31/26; G01R 27/14; G01R 29/08; G01R 3/00; G01R 1/18; G01R 19/0084; G01R 19/165; G01R 23/005; G01R 23/12; G01R 31/2635; G01R 31/2831; G01R 31/2832; G01R 31/302; G01R 31/50; G01R 31/52; G01R 31/54; G01R 35/00; G01R 35/005; G09G 2330/04; G09G 3/00; G09G 3/006
USPC ................................ 324/457, 452
See application file for complete search history.

(56) References Cited

U.S. PATENT DOCUMENTS

| | | | |
|---|---|---|---|
| 5,570,043 A * | 10/1996 | Churchill | ......... H03K 19/00315 326/27 |
| 6,900,642 B2 | 5/2005 | Zank et al. | |
| 6,922,059 B2 | 7/2005 | Zank et al. | |
| 7,088,175 B2 | 8/2006 | Krupka | |
| 8,624,663 B2 | 1/2014 | Gagne et al. | |
| 2008/0303530 A1 | 12/2008 | Coutsomitros et al. | |
| 2011/0169509 A1* | 7/2011 | Alini | ..................... G03B 21/53 324/686 |

(Continued)

FOREIGN PATENT DOCUMENTS

| | | |
|---|---|---|
| EP | 2980609 A1 | 2/2016 |
| KR | 1020110061750 A | 6/2011 |

*Primary Examiner* — Eman A Alkafawi
*Assistant Examiner* — Courtney G McDonnough
(74) *Attorney, Agent, or Firm* — SEED IP LAW GROUP LLP

(57) ABSTRACT

A device that provides high impedance contact pads for an electrostatic charge sensor. The contact pads are shared between the electrostatic charge sensor and drivers. The contact pads are set to a high impedance state by reducing current leakage through the drivers. Compared to electrostatic charge sensor with low impedance contact pads, the electrostatic charge sensor disclosed herein has high sensitivity, and is able to detect weak electrostatic fields.

16 Claims, 2 Drawing Sheets

(56) References Cited

U.S. PATENT DOCUMENTS

| | | |
|---|---|---|
| 2012/0306013 A1 | 12/2012 | Donovan et al. |
| 2014/0232516 A1 | 8/2014 | Stivoric et al. |
| 2015/0091850 A1 | 4/2015 | Morein et al. |
| 2016/0342781 A1 | 11/2016 | Jeon |
| 2019/0121483 A1 | 4/2019 | Liu et al. |
| 2019/0154615 A1* | 5/2019 | Muraoka ............ G01R 27/2605 |
| 2020/0067304 A1* | 2/2020 | Kim ....................... H01R 24/60 |
| 2023/0168290 A1 | 6/2023 | Orio |

* cited by examiner

… (1) …

ELECTROSTATIC CHARGE SENSOR WITH HIGH IMPEDANCE CONTACT PADS

BACKGROUND

Technical Field

The present disclosure is directed to circuitry for electrostatic charge sensors.

Description of the Related Art

Electrostatic charge sensors measure an electrostatic charge in a surrounding environment, and are used for a variety of applications, such as motion detection and location detection. Electrostatic charge sensors typically include one or more electrodes that detect electrostatic in the air of a surrounding environment, and various electrical components (e.g., resistors, capacitors, amplifiers, etc.) that measure the electrostatic charge detected by the one or more electrodes. The electrodes of the electrostatic charge sensor are often electrically connected to contact pads or pins of the containing device, such as a multi-sensor device, along with other electrical components.

Many electrostatic charge sensors suffer from current leakage. Electrical current will often drain from the contact pads, which are connected to the electrodes of the electrostatic charge sensor, due to the presence of other electrical components within the containing device. As more current leaks from the contact pads, the electrostatic charge signal detected by the electrodes lowers and eventually becomes unusable. Consequently, the sensitivity of the electrostatic charge sensor is drastically reduced, as it becomes difficult to measure weak electrostatic fields. Devices are especially susceptible to current leakage in higher temperatures.

BRIEF SUMMARY

The present disclosure is directed to a device with high impedance contact pads for an electrostatic charge sensor. The contact pads are shared between the electrostatic charge sensor and output drivers. The contact pads are set to a high impedance state by overcharging transistors of the output drivers with pumped electrical signals. The overcharging greatly reduces current leakage through the output drivers. As a result, compared to electrostatic charge sensor with low impedance contact pads, the electrostatic charge sensor disclosed herein has high sensitivity, and is able to detect weak electrostatic fields.

BRIEF DESCRIPTION OF THE SEVERAL VIEWS OF THE DRAWINGS

In the drawings, identical reference numbers identify similar features or elements. The size and relative positions of features in the drawings are not necessarily drawn to scale.

DETAILED DESCRIPTION

Figure 1:
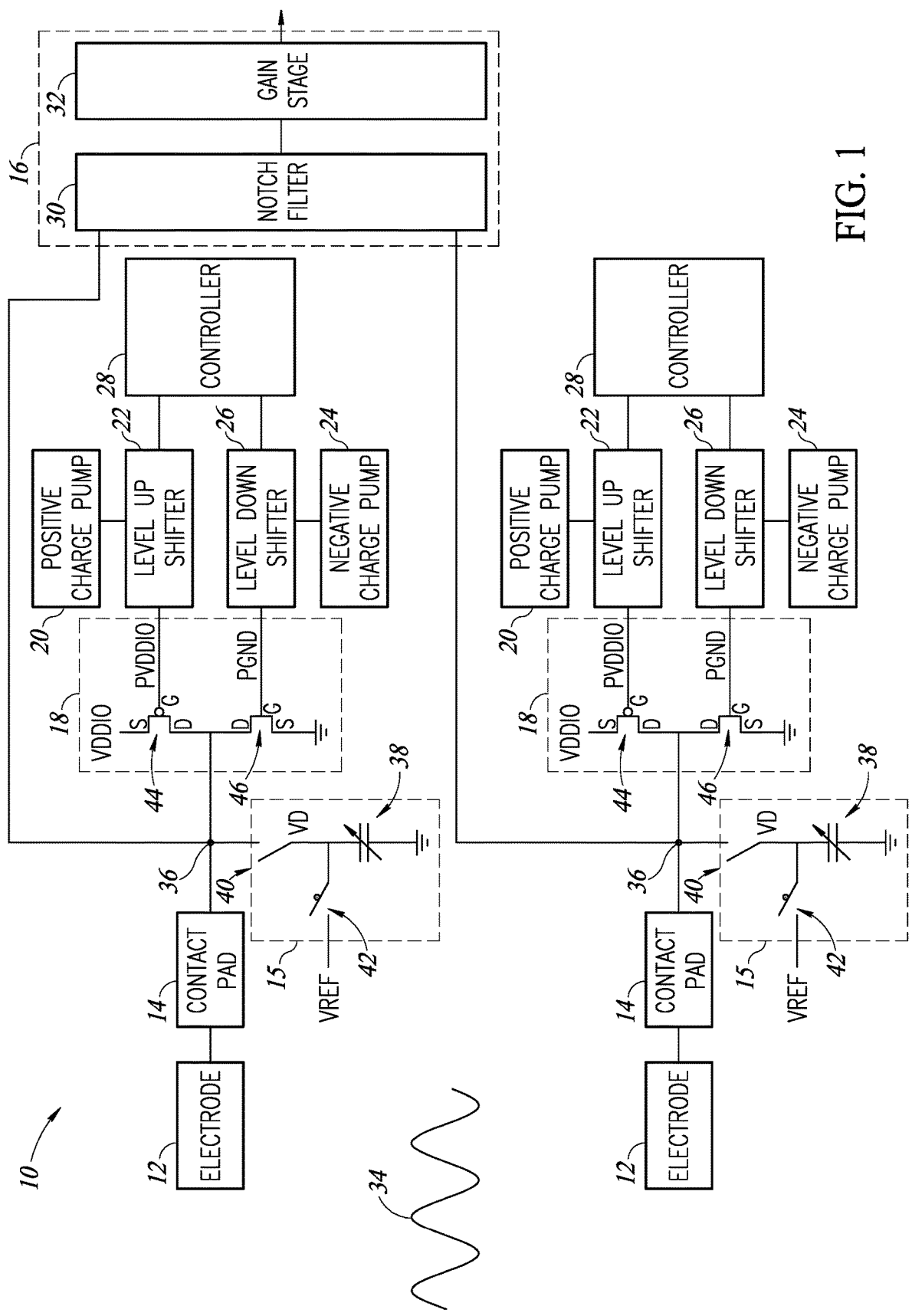
FIG. 1 is a block diagram of a device according to an embodiment disclosed herein.

In the following description, certain specific details are set forth in order to provide a thorough understanding of various aspects of the disclosed subject matter. However, the disclosed subject matter may be practiced without these specific details. In some instances, well-known structures and methods of manufacturing electronic components and sensors have not been described in detail to avoid obscuring the descriptions of other aspects of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

As discussed above, electrostatic charge sensors often suffer from current leakage as electrical current will often flow away from the contact pads that are connected to the electrodes of the electrostatic charge sensor. Current leakage is primarily caused by other electrical components that share the same contact pads.

In order to minimize or possibly eliminate current leakage from the electrostatic charge sensor, it is desirable to capture the electrostatic charge with contact pads having high impedance. One possible way to provide high impedance contact pads is to utilize dedicated contact pads for the electrostatic charge sensor. For example, a device may include contact pads that are electrically coupled exclusively to the electrodes of the electrostatic charge sensor, and electrically isolated from remaining components of the device. However, dedicated contact pads are often undesirable since many devices have a limited number of pins and are unable to allocate dedicated pins for a single sensor. Thus, it is common for each pin of a device to be shared for analog and digital purposes, such as for receiving electrical signals for various internal electrical components (e.g., processors, sensors, resistors, capacitors, amplifiers, etc.) and for outputting various electrical signals (e.g., driving signals, digital signals, communication signals, etc.). Output drivers in particular cause poor impedance of contact pads as large amounts of current will leak through the drivers themselves (leakage may be on the order of nano amps), as compared to the very small electrostatic charge being measured.

The present disclosure is directed to a device with high impedance contact pads for an electrostatic charge sensor. The contact pads are shared between the electrostatic charge sensor and, for example, output drivers. The contact pads are set to a high impedance state by overcharging transistors of the output drivers with pumped electrical signals. The overcharging greatly reduces current leakage through the output drivers. As a result, the electrostatic charge sensor disclosed herein has high sensitivity, and is able to detect weak electrostatic fields.

FIG. 1 is a block diagram of a device 10 according to an embodiment disclosed herein. The device 10 may be any electronic device that includes an electrostatic charge sensor. For example, the device 10 may be a smart watch, a fitness tracking device, wireless headphones, a laptop computer, a tablet, or a cellular phone. The device 10 may also be an electrical component, such as a multi-sensor device that includes other types of sensors (e.g., an accelerometer, a pressure sensor, a gyroscope, a proximity sensor, etc.).

The device 10 includes electrodes 12, contact pads 14, reset circuits 15, electrostatic charge sensor 16, output drivers 18, positive charge pumps 20, level up shifters 22, negative charge pumps 24, level down shifters 26, and controllers 28.

In the embodiment shown in FIG. 1, the device 10 includes a contact pad 14, a reset circuit 15, an output driver 18, a positive charge pump 20, a level up shifter 22, a negative charge pump 24, a level down shifter 26, and a controller 28 for each of the electrodes 12. The device 10 may also include circuitry that is shared between multiple electrodes. For example, one or more of the positive charge pump 20, the level up shifter 22, the negative charge pump 24, the level down shifter 26, and the controller 28 may be shared between the electrodes 12.

Each of the electrodes 12 is electrically coupled to a respective contact pad 14. The electrodes 12 receive an electrostatic charge or field 34 in a surrounding environment. The electrostatic charge 34 may be generated from a wide variety of sources, such as motion by person and a presence of an alternating current (AC) power line. Although two electrodes are shown in FIG. 1, the device 10 may include any number of electrodes. In one embodiment, the device 10 includes a single electrode.

The geometry of the electrodes 12 determines the sensitivity and directivity of the electrostatic charge sensor 16. For example, the sensitivity is proportional to the surface area of the electrodes 12, and the shape and position of the electrodes 12 affect the directivity of the electrostatic charge sensor 16. In one embodiment, each of the electrodes 12 is square in shape.

In one embodiment, the electrodes 12 are positioned inside of the device 10. For example, the electrodes 12 are mounted on a printed circuit board (PCB) of the device 10, along with other components of the device 10. In another embodiment, the electrodes 12 are positioned on one or more exposed surfaces of the device 10 such that the electrodes 12 are directly exposed to a surrounding environment.

The contact pads 14 are electrically coupled to respective electrodes 12 and nodes 36. The contact pads 14 are conductive contacts or pins that receive the electrostatic charge 34 received by the electrodes 12.

Each of the contact pads 14 may serve as input or an output for multiple circuits. For example, each of the contact pads 14 may be electrically coupled to, in addition to the electrostatic charge sensor 16 and the output driver 18 shown in FIG. 1, analog and digital circuits that output and receive signals (e.g., analog signals, digital signals, communication signals, etc.) via the contact pad 14.

Each of the reset circuits 15 is electrically coupled to a respective contact pad 14 via a respective node 36. The reset circuit 15 is used to set the node 36 to a voltage reference VREF prior to the electrostatic charge sensor 16 measuring electrostatic charge. Without the presence of the reset circuit 15, the node 36 may have any voltage level and cause an electrostatic charge signal received by the electrode 12 to drift, resulting in inaccurate measurements by the electrostatic charge sensor 16.

The reset circuit 15 has a charging phase and a reset phase. In the charging phase, a variable capacitor 38 of the reset circuit 15 is charged to the voltage reference VREF by closing switch 42 and opening switch 40. The reset circuit 15 is disconnected from the node 36 in the charging phase. The reset circuit may be in the charging phase when (1) the output driver 18, which is also electrically coupled to the node 36, is in an on state (e.g., outputting a driving signal) or (2) the electrostatic charge sensor 16 is currently measuring electrostatic charge. The on state of the output driver 18 will be discussed in further detail below.

In the reset phase, the variable capacitor 38, which is charged to the voltage reference VREF, is connected to the node 36 by opening switch 42 and closing switch 40. As a result, the node 36 is set or reset to the voltage reference VREF in the reset phase. The reset circuit 15 is in the reset phase when (1) the output driver 18 is in an off state (e.g., not outputting a driving signal) and (2) the electrostatic charge sensor 16 is currently not measuring electrostatic charge. As a result, the reset circuit 15 does not affect driving signals outputted from the output driver 18 and signals measured by the electrostatic charge sensor 16. The reset phase may be repeated at a determined frequency to repeatedly re-center to the node 36 at the voltage reference VREF. The off state of the output driver 18 will be discussed in further detail below.

The capacitance of the variable capacitor 38 may be set based on the application of the device 10. In general, a large capacitance allows the node 36 to be set to VREF more strongly (or with lower impedance), which in turn minimizes the effect of current leakage from the output drivers 18 on electrostatic charge measurements by the electrostatic charge sensor 16. However, the large capacitance reduces sensitivity of the electrostatic charge sensor 16.

The electrostatic charge sensor 16 is electrically coupled to the contact pads 14 via the nodes 36. The electrostatic charge sensor 16 measures electrostatic charge received by the electrodes 12. The electrostatic static charge sensor 16 measures electrostatic charge as a differential between electrostatic charges received by the two electrodes 12. As discussed above, each of the nodes 36 is set at, or at least near, the voltage reference VREF prior to measurement by the electrostatic charge sensor 16. Thus, during measurement by the electrostatic charge sensor 16, electrostatic charges received by the electrodes 12 are offset by an amount approximately equal to the voltage reference VREF. The electrostatic charge sensor 16 includes a notch filter 30 and a gain stage 32.

The notch filter 30 filters the measured electrostatic charge to remove noise or unwanted frequencies. For example, the notch filter 30 removes frequencies between 45 and 65 hertz to remove noise caused by AC power lines. Other types of filters are also possible. For example, the notch filter 30 may be replaced with a low pass filter, a high pass filter, or a band pass filter.

The measured electrostatic charge is then transmitted to the gain stage 32. The gain stage 32 amplifies or increases the power/amplitude of the measured electrostatic charge. The gain stage 32 then outputs the measured electrostatic charge for further processing. For example, the measured electrostatic charge may be transmitted to an analog-to-digital converter (ADC) to generate a digital signal indicating a variation of the electrostatic charge 34.

The electrostatic charge sensor 16 does not measure electrostatic charge while the output drivers 18 are in an on state (i.e., outputting driving signals). The electrostatic charge sensor 16 measure electrostatic charge while the output drivers 18 are in an off state (i.e., not outputting driving signals).

Each of the output drivers 18 is electrically coupled to respective contact pads 14 via the nodes 36. The output drivers 18 output driving signals as instructed by the controller 28. Each of the output drivers 18 include a p-channel metal-oxide semiconductor (PMOS) transistor 44 and an n-channel metal-oxide semiconductor (NMOS) transistor 46. A source of the PMOS transistor 44 receives a voltage VDDIO, a gate of the PMOS transistor 44 is electrically coupled to the level up shifter 22 and receives a PMOS gate signal PVDDIO, and a drain of the PMOS transistor 44 is electrically coupled to the node 36 and the source of the NMOS transistor 46. A drain of the NMOS transistor 46 is electrically coupled to the node 36 and the drain of the PMOS transistor 44, a gate of the NMOS transistor 46 is electrically coupled to the level down shifter 26 and receives a NMOS gate signal PGND, and a source of the NMOS transistor 46 is electrically coupled to ground. The voltage VDDIO, the PMOS gate signal PVDDIO, and the NMOS gate signal PGND are electrical signals.

In one embodiment, the PMOS transistor 44 and the NMOS transistor 46 are large transistors in order for high voltage driving signals to be outputted by the output drivers 18. For example, the PMOS transistor 44 may have a width between 550 and 650 micrometers, and the NMOS transistor 46 may have a width between 200 and 300 micrometers.

In an on state, the output driver 18 outputs driving signals (e.g., the voltage VDDIO or a grounded signal) as instructed by the controller 28. In the on state, either of the PMOS transistor 44 or NMOS transistor 46 is in a conducting state. The PMOS transistor 44 is set to a conducting state by applying a low voltage signal (e.g., 0 to 0.5 volts) to the gate of the PMOS transistor 44, and the NMOS transistor 46 is set to a conducting state by applying a high voltage signal (e.g., 4 to 5 volts) to the gate of the NMOS transistor 44.

In an off state, the output drivers 18 do not output driving signals and are in a high impedance state so as to not affect measurements by the electrostatic sensor 16. In the off state, the PMOS transistor 44 and the NMOS transistor 46 are in a non-conducting state. The PMOS transistor 44 is set to a non-conducting state by applying the PMOS gate signal PVDDIO to the gate of the PMOS transistor 44, and the NMOS transistor 46 is set to a non-conducting state by applying the NMOS gate signal PGND to the gate of the NMOS transistor 44. As will be discussed in further detail below, the PMOS gate signal PVDDIO and the NMOS gate signal PGND are pumped electrical signals.

The output drivers 18 may also be used to protect the device 10, more specifically other electrical components within the device 10, from being damaged by, for example, electrostatic discharge (ESD) though the contact pads 14. An ESD event may be caused by a person touching the electrodes 12 or the contact pads 14. The output drivers 18 may be used as protection circuits by, for example, setting the PMOS transistors 44 to a conducting state and allowing current to flow through the PMOS transistors 44.

The output drivers 18 are potential sources of current leakage and may cause the contact pads 14 to have low impedance. Even while the output drivers 18 are in the off state, current may leak from the contact pad 14 and through the output drivers 18 (e.g., through the PMOS transistor 44 and the NMOS transistor 46). For example, 100 picoamps to 10 nanoamps of current may leak through the PMOS transistor 44 and the NMOS transistor 46. Further, the amount of current leakage is proportional to the size of the output drivers 18 and temperature. Output drivers 18 with large transistors, such as the PMOS transistor 44 and the NMOS transistor 46, will have large amounts of current leakage compared to smaller transistors. Even further, in higher temperatures, the amount of current leakage increases even more. As more current leaks from the contact pad 14, the electrostatic charge received by the electrodes 12 lowers and eventually becomes unusable. Consequently, the sensitivity of the electrostatic charge sensor 16 is drastically reduced, as it becomes difficult to measure weak electrostatic fields.

In order to reduce or even eliminate current leakage through the output drivers 18 while in the off state, the output drivers 18 are provided with pumped signals at their respective gates. As discussed above, in the off state, the PMOS gate signal PVDDIO is applied to the gate of the PMOS transistor 44, and the NMOS gate signal PGND is applied to the gate of the NMOS transistor 44. In order to reduce or prevent current leakage through the output drivers 18, the PMOS gate signal PVDDIO is pumped to increase its voltage level above the voltage VDDIO, and the NMOS gate signal PGND is pumped to decrease its voltage level below ground (e.g., a negative value). In one embodiment, the PMOS gate signal PVDDIO is between 0.2 and 0.4 volts greater than the voltage VDDIO. In one embodiment, the NMOS gate signal PGND is between 0.2 and 0.4 volts less than ground. By overcharging the gates of the PMOS transistor 44 and the NMOS transistor 46 act as super cut-off mosfets and current leakage is reduced. Current leakage may be reduced to be less than 100 picoamps. As a result, the contact pads 14 are in a high impedance state while the output drivers 18 are in the off state.

Figure 2:
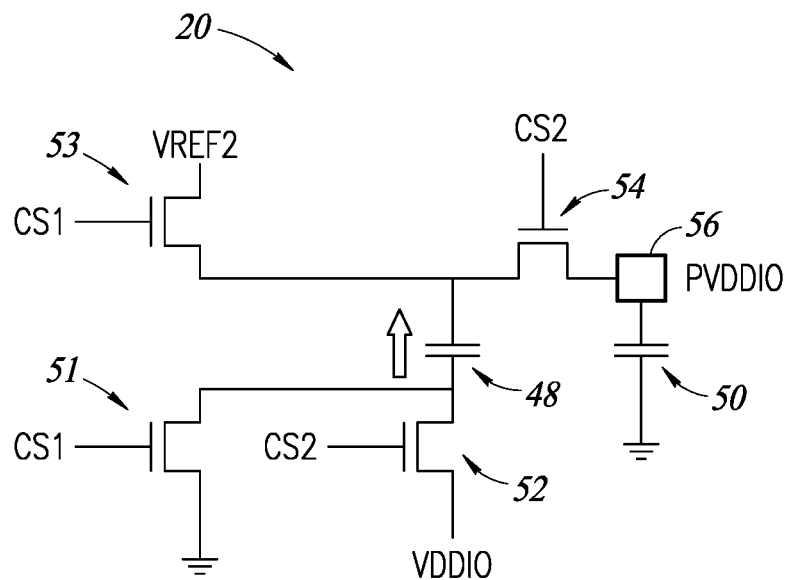
FIG. 2 is a circuit diagram of a positive charge pump according to an embodiment disclosed herein.

The positive charge pump 20 pumps the PMOS gate signal PVDDIO to increase its voltage level above the voltage VDDIO (e.g., between 0.2 and 0.4 volts greater than the voltage VDDIO). FIG. 2 is a circuit diagram of the positive charge pump 20 according to an embodiment disclosed herein.

The positive charge pump 20 includes a first capacitor 48, a second capacitor 50, a first switch 51, a second switch 53, a third switch 52, and a fourth switch 54. As shown in FIG. 2, the first switch 51, the second switch 53, the third switch 52, and the fourth switch 54 may be implemented as transistors.

The first capacitor 48 is electrically coupled between the first switch 51 and the second switch 53, and between the third switch 52 and the fourth switch 54. The second capacitor 50 is electrically coupled between the second switch 54 and ground. The first switch 51 is electrically coupled between the first capacitor and ground. The second switch 53 is electrically coupled to the first capacitor 48 and receives a voltage reference VREF2. In one embodiment, the voltage reference VREF2 is between 0.2 and 0.4 volts. The third switch 52 is electrically coupled to the first capacitor 48 and receives the voltage VDDIO. The opening and closing of the first switch 51 and the second switch 53 are controlled by a first control signal CS1, and the opening and closing of the third switch 52 and the second switch 54 are controlled by a second control signal CS2. In one embodiment, the first control signal CS1 and the second control signal CS2 are generated and provided by the controller 28.

During a first phase of operation, the first switch 51 and the second switch 53 are closed, and the third switch 52 and the fourth switch 54 are opened. Thus, in the first phase, the first capacitor 48 is charged by the voltage reference VREF2. Subsequently, in a second phase of operation, the first switch 51 and the second switch 53 are opened, and the third switch 52 and the fourth switch 54 are closed. As a result, the PMOS gate signal PVDDIO is generated at output 56. The PMOS gate signal PVDDIO is approximately the sum of the voltage reference VREF2 and the voltage VDDIO.

Returning to FIG. 1, the level up shifter 22 is electrically coupled to the gate of the PMOS transistor 44, the positive charge pump 20, and the controller 28. The level up shifter 22 shifts or converts control signals received from the controller 28 up to a desired voltage level for the PMOS transistor 44, more specifically the gate of the PMOS transistor 44.

In one embodiment, the level up shifter 22 provides the PMOS gate signal PVDDIO, which is generated by the positive charge pump 20, to the gate of the PMOS transistor 44 according to a control signal received from the controller 28. For example, the level up shifter 22 transmits the PMOS gate signal PVDDIO to the gate of the PMOS transistor 44 upon receiving an instruction from the controller 28 to set the output driver 18 to an off state. In another embodiment, the positive charge pump 20 transmits the PMOS gate signal PVDDIO directly to the gate of the PMOS transistor 44 according to control signals received from the controller 28.

Figure 3:
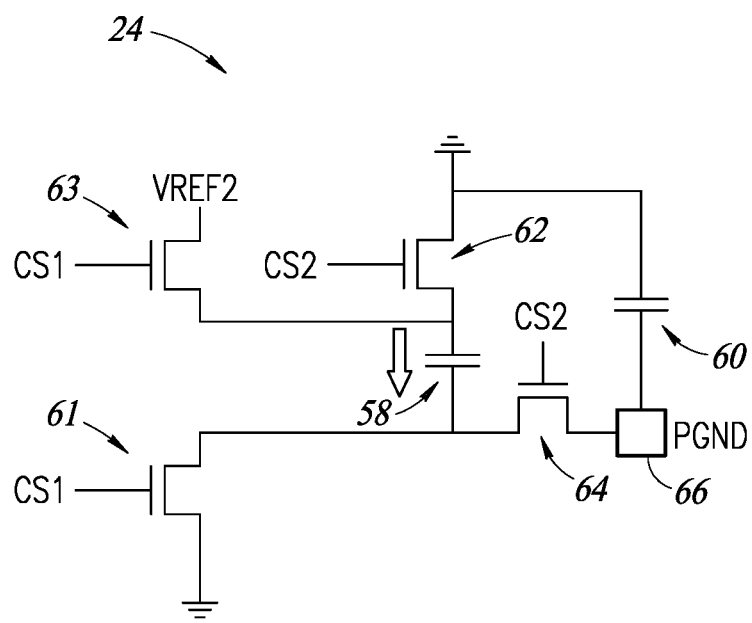
FIG. 3 is a circuit diagram of a negative charge pump according to an embodiment disclosed herein.

The negative charge pump 24 pumps the NMOS gate signal PGND to decrease its voltage level below ground (e.g., between 0.2 and 0.4 volts less than ground). FIG. 3 is a circuit diagram of the negative charge pump 24 according to an embodiment disclosed herein.

The negative charge pump 24 includes a first capacitor 58, a second capacitor 60, a first switch 61, a second switch 63, a third switch 62, and a fourth switch 64. As shown in FIG. 3, the first switch 61, the second switch 63, the third switch 62, and the fourth switch 64 may be implemented as transistors.

The first capacitor 58 is electrically coupled between the first switch 61 and the second switch 63, and between the third switch 62 and the fourth switch 64. The second capacitor 60 is electrically coupled between the second switch 64 and ground. The first switch 61 is electrically coupled between the first capacitor and ground. The second switch 63 is electrically coupled to the first capacitor 58 and receives a voltage reference VREF2. In one embodiment, the voltage reference VREF2 is between 0.2 and 0.4 volts. The third switch 62 is electrically coupled between the first capacitor 58 and ground. The opening and closing of the first switch 61 and the second switch 63 are controlled by a first control signal CS1, and the opening and closing of the third switch 63 and the second switch 63 are controlled by a second control signal CS2. In one embodiment, the first control signal CS1 and the second control signal CS2 are generated and provided by the controller 28.

During a first phase of operation, the first switch 61 and the second switch 63 are closed, and the third switch 62 and the fourth switch 64 are opened. Thus, in the first phase, the first capacitor 58 is charged by the voltage reference VREF2. Subsequently, in a second phase of operation, the first switch 61 and the second switch 63 are opened, and the third switch 62 and the fourth switch 64 are closed. As a result, the NMOS gate signal PGND is then generated at output 66. The NMOS gate signal PGND is below ground by approximately the voltage reference VREF2.

Returning to FIG. 1, the level down shifter 26 is electrically coupled to the gate of the NMOS transistor 46, the negative charge pump 24, and the controller 28. The level down shifter 26 shifts or converts control signals received from the controller 28 up to a desired voltage level for the NMOS transistor 46, more specifically the gate of the NMOS transistor 46.

In one embodiment, the level down shifter 26 provides the NMOS gate signal PGND, which is generated by the negative charge pump 24, to the gate of the NMOS transistor 46 according to a control signal received from the controller 28. For example, the level down shifter 26 transmits the NMOS gate signal PGND to the gate of the NMOS transistor 46 upon receiving an instruction from the controller 28 to set the output driver 18 to an off state. In another embodiment, the negative charge pump 24 transmits the NMOS gate signal PGND directly to the gate of the NMOS transistor 46 according to control signals received from the controller 28.

It is noted that the output drivers 18 are examples of circuits that may share the contact pads 14 with the electrostatic charge sensor 16. The positive charge pumps 20, the level up shifters 22, the level down shifters 26, and the negative charge pumps 24 discussed above may be used in conjunction with other types of circuits with transistors as well.

The various embodiments disclosed herein provide a device with high impedance contact pads. The contact pads are shared between an electrostatic charge sensor and output drivers. In order to reduce current leakage through the output drivers, the contact pads are set to a high impedance state by overcharging transistors of the output drivers. As a result, the electrostatic charge sensor disclosed herein has high sensitivity, and is able to detect weak electrostatic fields.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
    an electrode configured to receive an electrostatic charge;
    a contact pad electrically coupled to the electrode;
    an electrostatic charge sensor electrically coupled to the contact pad, the electrostatic charge sensor configured to measure the electrostatic charge; and
    a driver electrically coupled to the contact pad and ground, the driver configured to output a driving signal to the contact pad,
        the driver configured to be set to an on state in which the driver outputs the driving signal to the contact pad, and set to an off state in which the driver does not output the driving signal to the contact pad,
        the driver outputs the driving signal to the contact pad using a first electrical signal,
        the driver is set to the off state using a second electrical signal having a greater voltage level than the first electrical signal and a third electrical signal having a voltage level below ground,
        the electrostatic charge sensor does not measure the electrostatic charge in a case where the driver is set to the on state, and measures the electrostatic charge in a case where the driver is set to the off state;
    a level up shifter configured to provide the second electrical signal to the driver; and
    a level down shifter configured to provide the third electrical signal to the driver.

2. The device of claim 1 wherein
    the driver includes a p-channel metal-oxide semiconductor (PMOS) transistor, and an n-channel metal-oxide semiconductor (NMOS) transistor electrically coupled to the PMOS transistor and ground,
    a gate of the PMOS transistor is configured to receive the second electrical signal, and
    a gate of the NMOS transistor is configured receive the third electrical signal.

3. The device of claim 1 wherein the driver includes a first transistor, and a second transistor electrically coupled to the first transistor and ground.

4. The device of claim 3 wherein the first transistor is a p-channel metal-oxide semiconductor (PMOS) transistor, and the second transistor is an n-channel metal-oxide semiconductor (NMOS) transistor.

5. The device of claim 1 wherein
the driver is electrically coupled between the first electrical signal and ground, and
the device includes:
    a first charge pump configured to generate the second electrical signal; and
    a second charge pump configured to generate the third electrical signal.

6. The device of claim 1, further comprising:
a reset circuit electrically coupled to the contact pad via a node, the reset circuit configured to set the node to a determined voltage.

7. A device, comprising:
an electrode configured to receive electrostatic charge in a surrounding environment;
a contact pad electrically coupled to the electrode;
an electrostatic charge sensor electrically coupled to the contact pad, the electrostatic charge sensor configured to generate an electrostatic charge measurement indicating a variation of the electrostatic charge in the surrounding environment received by the electrode; and
a driver electrically coupled to the contact pad, the driver configured to output a driving signal to the contact pad,
    the electrostatic charge sensor does not generate the electrostatic charge measurement in a case where the driver outputs the driving signal to the contact pad, and generates the electrostatic charge measurement in a case where the driver does not output the driving signal to the contact pad.

8. The device of claim 7 wherein
the driver is electrically coupled between a first electrical signal and ground, and
the device includes:
    a first charge pump configured to generate a second electrical signal having a greater voltage level than the first electrical signal; and
    a second charge pump configured to generate a third electrical signal having a voltage level below ground, the driver configured to be set to an off state in which the driver does not output the driving signal to the contact pad using the second electrical signal and the third electrical signal.

9. The device of claim 8 wherein the driver includes a first transistor and a second transistor, the first transistor is electrically coupled between the first electrical signal and the second transistor, and the second transistor is electrically coupled between the first transistor and ground.

10. The device of claim 9 wherein the first transistor is a p-channel metal-oxide semiconductor (PMOS) transistor, and the second transistor is an n-channel metal-oxide semiconductor (NMOS) transistor.

11. The device of claim 10 wherein the driver is set to the off state by applying the second electrical signal to a gate of the first transistor, and the third electrical signal to a gate of the second transistor.

12. The device of claim 7, further comprising:
a reset circuit electrically coupled to the contact pad via a node, the reset circuit configured to set the node to a determined voltage in a case where the driver does not output the driving signal to the contact pad and the electrostatic charge sensor does not generate the electrostatic charge measurement.

13. The device of claim 7 wherein the driver includes a first transistor, and a second transistor between the first transistor and ground.

14. The device of claim 7, further comprising:
another electrode configured to receive the electrostatic charge in the surrounding environment; and
another contact pad electrically coupled to the another electrode,
    the electrostatic charge sensor being electrically coupled to the another contact pad,
    the electrostatic charge sensor configured to generate the electrostatic charge measurement using the electrostatic charge in the surrounding environment received by the electrode and the electrostatic charge in the surrounding environment received by the another electrode.

15. A device, comprising:
an electrode, which, in operation, receives electrostatic charge in a surrounding environment;
a contact pad electrically coupled to the electrode;
an electrostatic charge sensor electrically coupled to the contact pad, the electrostatic charge sensor, in operation, measures a variation of the electrostatic charge in the surrounding environment received and on the electrode; and
a driver electrically coupled to the contact pad,
    the driver outputs a driving signal to the contact pad using a first electrical signal in case the electrostatic charge sensor does not measure the variation of the electrostatic charge in the surrounding environment received and on the electrode,
    the driver being set to an off state in case the electrostatic charge sensor measures the variation of the electrostatic charge in the surrounding environment received and on the electrode.

16. The device of claim 15 wherein the driver is configured to be set to the off state using a second electrical signal having a greater voltage level than the first electrical signal and a third electrical signal having a voltage level below ground.

* * * * *